United States Patent [19]

Olsen et al.

[11] Patent Number: 4,631,805
[45] Date of Patent: Dec. 30, 1986

[54] SEMICONDUCTOR DEVICE INCLUDING PLATELESS PACKAGE FABRICATION METHOD

[75] Inventors: Dennis R. Olsen; Keith G. Spanjer, both of Scottsdale, Ariz.

[73] Assignee: Motorola Inc., Schaumburg, Ill.

[21] Appl. No.: 757,584

[22] Filed: Jul. 22, 1985

Related U.S. Application Data

[60] Division of Ser. No. 611,923, May 18, 1984, Pat. No. 4,596,374, which is a continuation of Ser. No. 246,784, Mar. 23, 1981.

[51] Int. Cl.$^4$ .............................................. H01L 23/48
[52] U.S. Cl. ........................................ 29/588; 29/589; 29/590; 29/591
[58] Field of Search ................. 29/588, 589, 590, 591; 228/121, 122, 123, 208; 357/67, 70, 71

[56] References Cited

U.S. PATENT DOCUMENTS

| | | | |
|---|---|---|---|
| 3,316,628 | 2/1966 | Lanj ................................. | 29/472.7 |
| 4,092,664 | 5/1978 | Davis, Jr. ............................ | 357/80 |
| 4,170,472 | 9/1979 | Olsen et al. ...................... | 75/175 A |
| 4,238,528 | 12/1980 | Myelo et al. ......................... | 427/96 |
| 4,321,617 | 3/1982 | Duda et al. .......................... | 357/71 |
| 4,346,396 | 8/1982 | Carroll, II et al. ................... | 357/70 |
| 4,498,121 | 2/1985 | Breedis et al. ..................... | 361/401 |
| 4,544,442 | 10/1985 | Lassen ................................ | 156/643 |
| 4,546,374 | 10/1985 | Olsen et al. ........................ | 351/71 |

OTHER PUBLICATIONS

M. Fogiel et al., "Modern Microelectronics", vol. 1, pp. 627-629, Research and Education Association, 1981.
S. K. Ghandhi, "VLSI Fabrication Principles", pp. 453-470, John Wiley and Sons, Inc. 1983.

*Primary Examiner*—Brian E. Hearn
*Assistant Examiner*—Tuan Quach
*Attorney, Agent, or Firm*—John A. Fisher; Raymond J. Warren

[57] ABSTRACT

A semiconductor device including a metallurgically compatible unplated package is provided. The package includes a plateless copper alloy die mount area to which a semiconductor die is attached. The semiconductor die is metallized on its mounting surface to provide electrical contact. A metallic solder which is compatible with both the copper alloy and the die metallization joins the die to the die mount area. The package further includes a plateless copper alloy lead portion which is physically joined to the die mount area. The top surface of the semiconductor die is provided with a patterned metallization making electrical contact to selected portions of the die. Electrical contact is made between the top surface die metallization and the lead portion of the package by ultrasonically bonded copper ribbon. The die and interconnecting ribbon is then enclosed by an epoxy encapsulant or by a welded metal cover.

22 Claims, 3 Drawing Figures

SEMICONDUCTOR DEVICE INCLUDING PLATELESS PACKAGE FABRICATION METHOD

This is a division of application Ser. No. 611,923, filed 5/18/84 now U.S. Pat. No. 4,596,374, which was a continuation of Ser. No. 246,784, filed 3/23/81.

BACKGROUND OF THE INVENTION

This invention relates in general to a semiconductor device structure and more particularly to a semiconductor die mounted and bonded to a plateless copper alloy package.

A semiconductor device typically includes a semiconductor die and a package or housing for the die. The package includes a die mount portion and a lead portion. The die, including diffused regions, junctions, and the like, is metallized on both its top and bottom surfaces. A solder is used to bond the bottom metallization to the die mount portion of the package. Wire leads bond to and interconnect the top metallization and the package lead portion. The die and interconnecting leads are then enclosed within the package. The enclosure comprises either plastic encapsulation molded about the die and part of the die mount and lead portions or a metal cover welded to the mounting portion and extending over the die.

The die mount portion of the package provides mechanical support, electrical contact, and functions as a heat sink. The die is usually attached to the die mount portion using soft solder, hard solder, or conductive epoxy. Each of these mounting materials has characteristic advantages and disadvantages. The soft solders, for example, which are lead-based or tin-based alloys, are inexpensive, but are susceptible to thermal fatigue and higher electrical and thermal resistance than the hard solders. Hard solders are gold-based alloys and provide highly reliable bonds having good thermal, electrical, and mechanical properties, but the gold-based hard solders are very expensive. Conductive epoxies, like the soft solders, are less expensive but provide less desirable bonds than do the hard solders and often contain precious metal fillers.

The back of the semiconductor die is metallized to provide a bondable surface. When solder is used for bonding the back metallization must be compatible with the solder chosen. Likewise, the solder must be compatible with the metal of the die mount portion. That is, the back metal, solder, and die mount metal must all be metallurgically compatible. Metallurgically compatible means the solder is capable of wetting and forming a strong bond to the metallic surfaces it contacts but forms no undesirable intermetallics at the bond. In contrast, gold and tin can form a brittle intermetallic which is fracture prone and would therefore provide a low reliability bond.

The requirement of compatibility has typically led to the use of clad or plated die mount regions. The underlying material for the die mount region is selected for its thermal, electrical and mechanical properties. The cladding or plating provides the required metallurgical compatibility. Depending on the solder system chosen, the die mount region is over coated with a thin layer of material, usually either nickel or gold. This adds the expense of the plating or cladding operation as well as the cost of the material itself to the total cost of the device.

The front surface of a semiconductor die is metallized with a patterned metal layer which allows electrical contact to, for example in the case of the bipolar transistor, the base and emitter electrodes of the transistor. This patterned metallization is connected to the lead portion of the semiconductor package by fine wires (typically in the range of 25–500 micrometers in diameter) which are bonded between the surface metallization and the package leads. The wires are usually aluminum or gold, the top surface metallization is aluminum or a number of alternative multi-layer metal systems, and the package leads are plated with nickel or gold. The lead plating or cladding is necessary for metallurgical compatibility between the aluminum or gold wires and the rigid material of the package leads. Here there is no requirement for solder wetting, but metallurgical compatibility again requires that no undesirable intermetallics form at the bond. Again, the plating or cladding of the package leads is expensive and further expense is added by the gold wires, where used.

The total semiconductor device, assembled as described above, is best by a number of shortcomings. Assembling the semiconductor device requires the selection from among various metallurgical alternatives and requires tradeoffs with regard to such variables as cost, thermal and electrical properties, and reliability. Reliability, for example, may be compromised by the formation of aluminum-gold intermetallics. Because of these shortcomings and required tradeoffs, a need existed for an improved semiconductor device assembly.

It is therefore an object of this invention to provide an improved semiconductor device assembled on a plateless copper alloy package member.

It is a further object of this invention to provide an improved metallurgically compatible back-surface metallization, metallic solder, and unplated die mount package member.

It is a still further object of this invention to provide a front-surface metallization and lead bonding means compatible with an unplated copper alloy package lead portion.

It is a still further object of this invention to provide an improved device metallization forming no intermetallics.

It is another object of this invention to provide a semiconductor die metallurgically bonded to an unplated copper alloy die mount package member and lead bonded to an unplated copper alloy lead portion package member.

It is still another object of this invention to provide a housed semiconductor device mounted on an unplated mounting member package portion and having improved reliability properties.

SUMMARY OF THE INVENTION

The foregoing and other objects and advantages are achieved in the present invention through the use of a semiconductor die contacted by compatible metal systems in combination with unplated package members. In one embodiment of the invention the semiconductor device includes a semiconductor die metallized on its first surface and attached to an unplated copper alloy die mount portion of the package using a solder composition metallurgically compatible with both the die metallization and the copper alloy package portion. A copper ribbon is bonded between and electrically interconnects an unplated copper alloy lead portion of the package and a metallization layer patterned on a second surface of the semiconductor die. The copper ribbon is metallurgically compatible with the lead portion and the patterned metallization layer. The die and interconnecting ribbon are encapsulated to provide mechanical and ambient protection.

DETAILED DESCRIPTION OF THE PREFERRED EMBODIMENT

Figure 1:
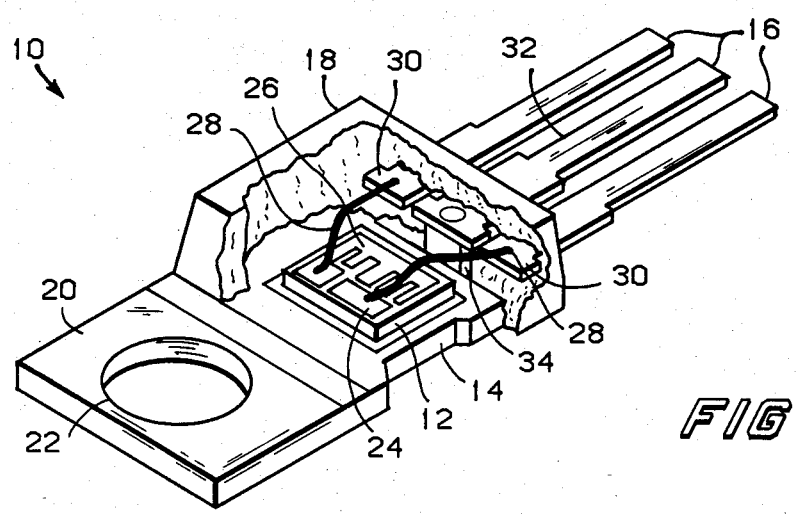
FIG. 1 illustrates in a partially cut-away, perspective view a plastic encapsulated semiconductor device in accordance with the invention.

FIG. 1 illustrates, in a partially cut-away view, one embodiment of a semiconductor device 10 in accordance with the invention. Device 10, shown here to be a silicon bipolar transistor, comprises a semiconductor die 12 which is bonded and encapsulated within a protective package. The package includes a die mount portion 14, lead portion 16, and a molded plastic encapsulant 18.

Die 12 is metallurgically bonded to the die mount portion 14. The die mount portion provides a mechanical support, provides electrical contact to the back or collector of the transistor die, and functions as a heat sink for dissipation of heat generated in operation of the device. The die mount portion may also include a flange portion 20 having a mounting hole 22 extending through the flange. The flange and hole facilitate the mounting of the device, for example, to an electrical chassis or heat sink.

On the top surface of die 12 is a patterned metallization including base metal 24 and emitter metal 26 making electrical contact to the base and emitter terminals of the transistor, respectively. Leads 28 which are metal wires or preferably ribbons interconnect the base and emitter metal with the lead portion 16. The leads are bonded, preferably by ultrasonically assisted bonding techniques, between the top surface metallization and a bonding area 30 located at the ends of lead portion 16. One of the leads 32 of the lead portion 16 is mechanically joined to a post portion 34 of the die mount portion 14. This serves to mechanically interconnect the die mount and lead mount portions of the package and also provides electrical interconnections between the collector portion of the transistor die and the package lead portion. The joining together of the two package portions and the bonding of leads 28 between the die and the lead portions 16 provides a means for making electrical contact to the often very small and sensitive transistor die. A user of the semiconductor device can then make effective electrical contact external to the package.

To complete device 10 the bonded semiconductor die, the interconnecting leads, and parts of the die mount portion and the lead portion are encapsulated in a molded protective plastic housing 18. The plastics protects the die and leads from mechanical damage and from contamination. The plastic encapsulation also mechanically supports the lead portion 16 and maintains the correct positioning of the package parts.

Figure 2:
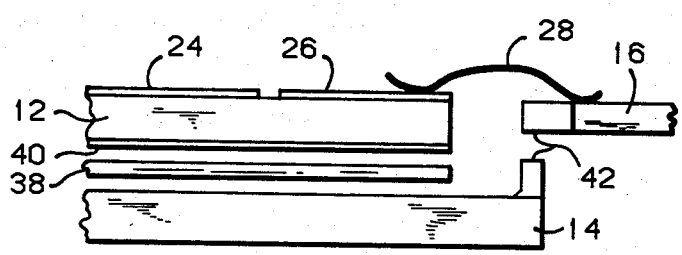
FIG. 2 schematically illustrates in cross-section the assembly of a semiconductor device.

FIG. 2 illustrates in an exploded view the assembly of a semiconductor device in accordance with the invention. The semiconductor die 12 has a patterned front metallization 24, 26. The underside of the die is metallized with a layer of metal 40 which makes good electrical and mechanical contact to the underside of the die. Solder 38 is used to joint the semiconductor die to the package die mount portion 14. The solder is supplied either as a preform, by pretinning the die mount area, or by precoating the underside of the die.

In accordance with the invention, the die mount portion 14 is formed of copper or a copper alloy and remains unplated. Copper or selected copper alloys are chosen for the package portions because of their desirable thermal, electrical, and mechanical properties. Plating or cladding of die mount portion 14 which would add to the expense of the device is unnecessary. The term "unplated copper alloy" is meant to include surface alloys and intermetallics formed by applying thin surface layers to the package portion and subsequently heating to form a shallow surface alloy, and especially wherein the heating comprises meterly the normal subsequent bonding steps. That is, "unplated" does not mean "uncoated"; unplated does not exclude protective coatings such as methyl methacrylate or other acrylic.

Having selected a copper or copper alloy as the material for the die mount portion, a solder 38 is selected which will bond directly to that material. The conventional hard and soft solders, besides having the various disadvantages previously noted, will not bond directly to copper in a repeatable and reliable fashion. A tin-silver-antimony solder as disclosed in U.S. Pat. No. 4,170,472 is therefore a preferred solder in this application. Specifically, a solder comprised, in weight percent, of about 61–69 tin, 8–11 antimony, the 23–28 silver is preferred. This solder has properties somewhat intermediate between those of the hard and soft solders and combines many of the desirable features of the various prior art solders. The tin-silver-antimony solder bonds directly to the unplated die mount area.

A metallization layer 40 is applied to the back of the semiconductor die to provide good electrical contact to the die and to provide a solderable surface. The metallization layer must adhere to the die and provide an ohmic electrical connection; it must also be metallurgically compatible with the solder chosen for the die bond. A preferred metallization layer comprises sequential layers of titanium, nickel, and silver. The titanium contacts the exposed back of the silicon wafer. Upon heating, a titanium silicide is formed which provides a good electrical contact as well as a strong metallurgical bond to the wafer. The silver forms a strong bond with the solder. The intermediate nickel layer acts as a barrier to prevent silver migration to the silicon wafer. Alternate metallization layers can be used, but the Ti-Ni-Ag system is preferred. An alternate metallization layer, for example, comprises sequential layers of chromium and silver, but chromium silicide exhibits a weaker mechanical bond to the silicon and is metallurgically inferior to the bond formed by titanium.

Package lead portion 16 is also formed of unplated copper or copper-alloy. Copper alloys are preferred because they impart to the lead portion a desirable amount of rigidity. the rigidity is required, for example, to permit the easy insertion of the leads into a socket or in holes in a printed circuit board and to maintain the location of the device once it has been wired into a circuit.

The lead portion 16 and die mount portion 14 are physically joined together at area 42. The joining together is accomplished before the die mount operation. Because in this embodiment the die mount portion and lead mount portion are initially separate, the two can be formed from the same alloy or from different copper alloys having different metallurgical properties to accommodate a particular need. The lead portion, for example, can be of an alloy which has higher yield strength or hardness in contrast to the die mount portion which can be of a softer alloy to facilitate the die bonding. In an alternate embodiment (not shown) the die mount portion and lead portion are formed as a single unitary structure. In such embodiment, of course, the two portions must be formed of the same material.

On the top surface of the die is a patterned metal layer indicated by reference numbers 24 and 26. The metal layer makes electrical contact to device regions such as the base and emitter of the transistor. Leads 28 interconnect the patterned metallization with the package lead portion. Aluminum wires, used in conventional packages, are less reliable for bonding to the unplated copper alloy package. Gold wires can be used, but only with stringent and restrictive process limitations. Additionally, the gold leads are very expensive. In accordance with the present invention, leads 28 comprise copper or copper alloy and are used to bond directly to the copper alloy package. Patterned metal layers 24, 26 must be compatible with leads 28. Accordingly, layers 24, 26 preferably comprise sequential layers of titanium, nickel and copper. The titanium is in direct contact with the semiconductor die and makes good electrical and mechanical contact. The copper layer makes possible a strong bond to the copper lead. The nickel layer provides a barrier to the migration of copper and prevents the migration of copper to the semiconductor die where it can have adverse effects upon device performance. The Ti-Ni-Cu metal system is also preferred because the three metals can be etched in a single etch operation; for example, in an etchant comprising nitric acid, acetic acid, hydrofluoric acid and water. Alternative metal systems, such as Al-TiW-Cu are metallurgically acceptable but have the disadvantage of requiring three separate etchants and thus three separate etch steps to pattern the layer.

Precautions must be taken to prevent the oxidation of the unplated copper surface during the assembly of the semiconductor device. Oxidation of the surface inhibits the proper metallurgical bonding and can cause problems with assembly yields and reliability. During the melting of the solder, therefore, the heated package members are maintained under a flowing inert or reducing ambient such as nitrogen or forming gas to prevent oxidation which will interfere with the die bonding or subsequent wire bonding. The leads are attached to the top metallization and to the package leads using ultrasonically assisted bonding techniques. Such techniques minimize heating, especially in comparison to thermal compression or ballbonding techniques. Ultrasonic wire bonding is a room temperature operation so no special protective ambient is required to prevent oxidation during bonding.

Leads 28 are preferably in the form of a copper ribbon instead of a circular cross-section wire. Copper leads are harder to deform than are the conventional aluminum or gold leads. The flat ribbon shape distributes the ultrasonic energy over the total bonding area and requires less deformation than does the circular cross-section wire. Ultrasonic bonding of the copper ribbon makes the bonding more controllable in comparison to other metals. The relatively harder copper deforms very little, forms a uniform and reproducible bond area, and thus reduces the number of shorts which can result from excessive deformation.

After die bonding and lead bonding, the semiconductor die and the bond areas are coated with a die coat. The die coat appears to be mandatory to prevent the migration of copper and the formation of dendrites at the copper-copper bonds. Polyimides are preferred die coat materials. The die coat forms a first barrier layer protecting the die and bonds from the ambient.

To complete the encapsulation of the semiconductor device, a plastic housing 18 as shown in FIG. 1 is injection or transfer molded about the die and a portion of the lead and die mount package parts. The plastic may be epoxy, polyimide, engineering plastic, or the like.

Figure 3:
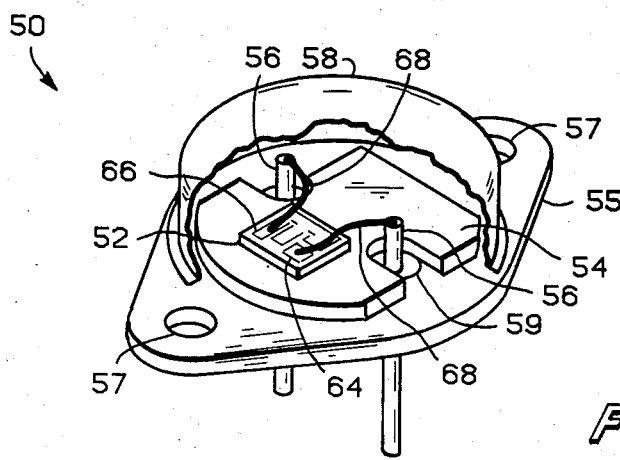
FIG. 3 illustrates in partially cut-away perspective view a further embodiment of the invention.

FIG. 3 illustrates an alternative embodiment of the present invention in which unplated copper or copper alloy parts are assembled into a non-plastic device 50. Device 50 comprises a semiconductor die 52 mounted on unplated pedestal 54 which, in turn, is mounted on a header base 55. Alternatively the plateless pedestal can be part of the base itself. The base serves to facilitate mounting of the semiconductor device. Holes 57 in each end of the base allow the device to be attached to a heat sink, chassis, or the like.

Copper alloy bonding posts 56 protrude through holes in the base and are physically secured to the base by insulating glass eyelets 59 which are melted to fuse the leads in place. Metal cover 58, shown partly cut away, is welded to the base to provide a hermetically sealed enclosure within which the ambient can be controlled.

Semiconductor device 50 is assembled in a manner similar to that described above with respect to FIG. 2. Copper leads 68 are bonded between the copper alloy bonding post 56 and patterned metallization 64, 66 on the top surface of the die. The leads are preferably copper ribbon and are ultrasonically bonded to both the package posts and the metallization. To be compatible with these copper leads, the top surface metallization preferably comprises sequential layers of titanium, nickel, and copper. The die is metallized on its bottom surface to provide electrical contact to the die and to provide a solderable surface. A solder joins this metallized layer to the copper alloy die mount pedestal. The solder, as above, must be metallurgically compatible with the copper alloy and with the bottom surface metallization and is advantageously a tin-silver-antimony alloy. The bottom surface metallization preferably comprises sequential layers of titanium, nickel, and silver.

More specifically, by way of further illustration, a number of silicon bipolar power transistors are assembled in packages substantially as illustrated in FIG. 1. The front surface of the transistors are metallized with sequential layers of titanium, nickel, and copper. The titanium layer, directly contacting exposed portions of the silicon die surface, has a thickness of about 50–100 nanometers. Overlying the titanium is a layer of nickel having a thickness of about 300–500 nanometers. Finally, a layer of copper having a thickness of about 4–6 micrometers is formed on the nickel. The metal layers are patterned in a single etch step using an $HF-HNO_3-CH_3COOH$—water etch solution to form base and emitter contacts.

The back surface of the transistors are metallized with sequential layers of titanium, nickel and silver having thicknesses of about 100, 500, and 4000 nanometers, respectively.

The die mount package portion is formed of alloy C19400, a copper alloy of iron and zinc. The transistor is attached to the die mount package portion using a tin-silver-antimony solder. The solder is preformed on the package in a reducing atmosphere. Bonding of the transistor to the package is done in a reducing atmosphere at about 350°-450° C.

The lead portion package member is formed of alloy C15500, a copper alloy of silver and magnesium. Copper ribbon having a cross-section of about 75 micrometers by 125 micrometers is ultrasonically bonded between the patterned base and emitter metal and the package lead portions.

The transistor, ribbon, exposed die attach area and the bonded ends of the wire attach portion are coated with a polyimide die coat. The polyimide is cured by baking at about 300° C. Following the die coat process, the die and portions of the metal package members are encapsulated by injection molding a protective epoxy housing.

The devices are subjected to tests designed to screen for the most commonly occurring failures found with such devices, namely mechanical failure of the die attachment to the package, mechanical failure of the lead attachment to base or emitter, and moisture penetration of the molding compound. The tests include, for example, power cycling or intermittent operating life tests and high humidity, high temperature reverse bias testing.

The percentage of device failures, defined as a specified change in $V_{BEF}$, $BV_{CEO}$, $H_{FE}$, and the like, is reduced for the devices made in accordance with the invention as contrasted to conventionally assembled devices.

Thus it is apparent that there has been provided, in accordance with the invention, a novel semiconductor device that fully meets the objects and advantages set forth above. The device includes unplated copper or copper alloy package parts and metallurgically compatible metal systems and solder for assembling the device. While the invention has been described in conjunction with specific device and package types, it is not intended that the invention or its usage to be so limited. The invention can also be used, for example, for other devices and integrated circuits assembled in various package types. Other variations and modifications will be apparent, of course, to those skilled in the art in light of the foregoing description. Accordingly, it is intended to embrace all such variations and modifications as fall within the scope of the invention.

We claim:

1. A method for packaging a semiconductor device which comprises the steps of: providing a semiconductor die; providing a plateless copper alloy package bonding portion; providing a plateless copper alloy package lead portion; said bonding portion positioned with respect to said lead portion; applying a metal layer to a first side of said semiconductor die; bonding said metal layer to said bonding portion using a metal solder metallurgically compatible with said copper alloy and said metal layer; applying a patterned metal to a second side of said semiconductor die; ultrasonically bonding copper ribbon between said patterned metal and said package lead portion; and encapsulating said semiconductor die.

2. The method of claim 1 further comprising the step of applying a die coat over said semiconductor die.

3. The method of claim 2 wherein said die coat comprises a polyimide.

4. The method of claim 1 wherein said step of encapsulating comprises injection molding.

5. A method for packaging a semiconductor device which comprises the steps of: providing a semiconductor die and a copper alloy package having a plateless bonding portion and a plateless lead portion; forming a first metallization on a first surface of said semiconductor die; forming a second patterned metallization on a second surface of said semiconductor die; soldering said semiconductor die to said plateless bonding portion with a solder which is metallurgically compatible with both said first metallization and said copper alloy; ultrasonically bonding electrical conductors between said plateless lead portion and said second patterned metallization; and encapsulating said semiconductor die, said electrical conductors and interior portions of said package in a protective enclosure.

6. The method of claim 5 wherein said step of forming a first metallization comprises the steps of sequentially applying to said first surface layers of titanium, nickel, and silver.

7. The method of claim 6 wherein said step of soldering comprises the step of melting a solder comprising tin, silver, and antimony in contact with said first metallization and said plateless bonding portion.

8. The method of claim 7 wherein said melting is done in a reducing ambient.

9. The method of claim 5 wherein said step of forming a first metallization comprises the steps of sequentially applying to said first surface layers of chromium and silver.

10. The method of claim 5 wherein said step of forming a patterned metallization comprises forming a copper surface layer.

11. The method of claim 10 wherein said step of forming a second patterned metallization comprises forming a contact layer making electrical contact to portions of said semiconductor die, a barrier layer, and a surface layer.

12. The method of claim 11 wherein said contact layer comprises titanium.

13. The method of claim 11 wherein said barrier layer comprises nickel.

14. The method of claim 10 wherein said step of forming a second patterned metallization comprises forming sequential layers of titanium, nickel, and copper.

15. The method of claim 10 wherein said step of forming a second patterned metallization comprises forming sequential layers of aluminum, titanium tungsten, and copper.

16. The method of claim 10 wherein said step of ultrasonically bonding comprises bonding a copper conductor between said plateless lead portion and said copper surface layer.

17. The method of claim 16 wherein said copper conductor comprises a copper ribbon.

18. The method of claim 5 wherein said step of encapsulating comprises coating said semiconductor die with a die coat.

19. The method of claim 18 wherein said die coat comprises a polyimide.

20. The method of claim 18 wherein said step of encapsulating comprises forming a plastic housing.

21. The method of claim 5 wherein said step of encapsulating comprises forming a plastic housing.

22. The method of claim 5 wherein said step of encapsulating comprises welding a cover member to said plateless bonding portion.

* * * * *